United States Patent [19]

Meunier et al.

[11] Patent Number: 5,297,684
[45] Date of Patent: Mar. 29, 1994

[54] AVIONIC TRAY

[75] Inventors: Bernard Meunier, Boutigny-sur-Essonne; Denis Pavie, Ballancourt-sur-Essonne; Michel Pompei, Villiers-sur-Orge, all of France

[73] Assignee: Vibrachoc, Evry Cedex, France

[21] Appl. No.: 93,711

[22] Filed: Jul. 20, 1993

[30] Foreign Application Priority Data

Jul. 24, 1992 [FR] France .................. 9209172

[51] Int. Cl.⁵ .............................. G12B 9/00
[52] U.S. Cl. .................... 211/26; 361/825; 138/173
[58] Field of Search ............ 211/26, 41; 361/383, 361/382, 384, 392, 393; 248/27.1; 138/173; 220/72

[56] References Cited

U.S. PATENT DOCUMENTS

| | | | |
|---|---|---|---|
| 3,688,803 | 9/1972 | Pavia | 138/173 |
| 3,710,476 | 1/1973 | Hollingshead et al. | 248/27.1 X |
| 3,771,023 | 11/1973 | Hollingshead et al. | 361/383 |
| 4,044,515 | 8/1977 | Hollingshead et al. | 361/383 |
| 4,458,297 | 7/1984 | Bryant et al. | 361/383 |
| 4,687,127 | 8/1987 | Pardo et al. | 361/383 |
| 4,766,517 | 8/1988 | Abell | 361/383 |
| 5,190,241 | 3/1993 | Pease | 248/27.1 X |

FOREIGN PATENT DOCUMENTS

0421847A1  4/1991  France .

*Primary Examiner*—Robert W. Gibson, Jr.
*Attorney, Agent, or Firm*—Sughrue, Mion, Zinn, Macpeak & Seas

[57] ABSTRACT

An avionic tray is fixed to a shelf and comprises a base plate, side rails and a back plate. At least a forward end of the base plate of the tray is reinforced by a reinforcing plate fixed to the upper surface of the base plate. The part of the base plate carrying the reinforcing plate is stepped downwards so that the upper surface of the reinforcing plate is level with the surface of the base plate to the rear of the reinforcing plate. Fixing holes are provided in the reinforcing plate and the base plate for fixing the tray to the shelf by means of screws whose heads are housed in housings in the reinforcing plate.

2 Claims, 2 Drawing Sheets

AVIONIC TRAY

BACKGROUND OF THE INVENTION

1. Field of the Invention

The present invention concerns an avionic tray.

2. Description of the Prior Art

Avionic equipment is housed in standard size cases. There are various standard case sizes of various widths. Each case is an interchangeable removable modular unit which is placed in a tray. The tray has latches at the front which attach to fixing lugs on the case and at the rear of the case is an electrical connector which plugs into a complementary connector fixed to the rear of the tray. The trays are fixed side by side along shelves.

The present invention concerns a tray of this kind. Given their use in aerospace applications, they must be light in weight. They are therefore made from thin aluminum. The standard thickness is 1.6 mm. The trays are subject to high mechanical loads, however, and so must be strong and resistant to metal fatigue. Some parts of the tray are therefore reinforced, in particular the front and rear parts of the base plate of the tray where it is screwed to the shelf.

The appended FIG. 1 is a partial perspective view of the front part of a known type tray 1. The bottom or base plate 2 of the U-shape tray front part is reinforced underneath by a reinforcement plate 3 riveted and/or spot welded to the base plate 2 of the tray. The tray 1 is fixed to the shelf 4 by screws 5. The screwheads must be flush to allow insertion of the equipment case. The screws are therefore countersunk and are accommodated in a countersink 6 at the upper end of the screw hole 7. An alternative is to stamp a well to accommodate the screwhead.

This arrangement is satisfactory in terms of increasing the stiffness of the tray but is not satisfactory with respect to resistance to metal fatigue caused by vibration, and cracks appear at the edges of the holes through which the screws fixing the tray to its shelf pass. As already mentioned, the metal of the tray is thin and the thickness is reduced around the fixing screw holes by the countersink to accommodate the screwhead. In the case of a stamped housing for the screwhead, this area is also more fragile. The fixing of the reinforcing plate 3 to the bottom of the base plate 2 of the tray 1 is not an intimate fixing over all of the reinforcement surface but rather a fixing at individual points (spot welds and/or rivets, as mentioned above). When the tray is subject to transverse loads the reinforcement plate 3 under the base plate 2 takes much less of the load than the base plate which is directly under the screwheads. As already mentioned, this causes cracks to appear at the edges of the screw holes in the base plate 2.

An object of the present invention is to overcome this drawback.

SUMMARY OF THE INVENTION

The present invention consists in an avionic tray adapted to be fixed to a shelf and comprising a base plate, side rails and a back plate, wherein at least a forward end of said base plate of said tray is reinforced by a reinforcing plate fixed to the upper surface of said base plate, the part of said base plate carrying said reinforcing plate is stepped downwards so that the upper surface of said reinforcing plate is level with the surface of said base plate to the rear of said reinforcing plate, and fixing holes are provided in said reinforcing plate and said base plate for fixing said tray to said shelf by means of screws whose heads are housed in housings in said reinforcing plate.

According to the invention the reinforcing plate, which is loaded much less than the base plate, receives the heads of the fixing screws directly. The reinforcing plate is advantageously thicker than the base plate of the tray. Vibration fatigue tests have produced excellent results. No cracks appear at the edges of the fixing holes.

As in the prior art the reinforcing plate is fixed to the base plate of the tray by riveting and/or spot welding.

The invention will now be described with reference to the appended drawings.

DETAILED DESCRIPTION OF THE INVENTION

Figure 1:
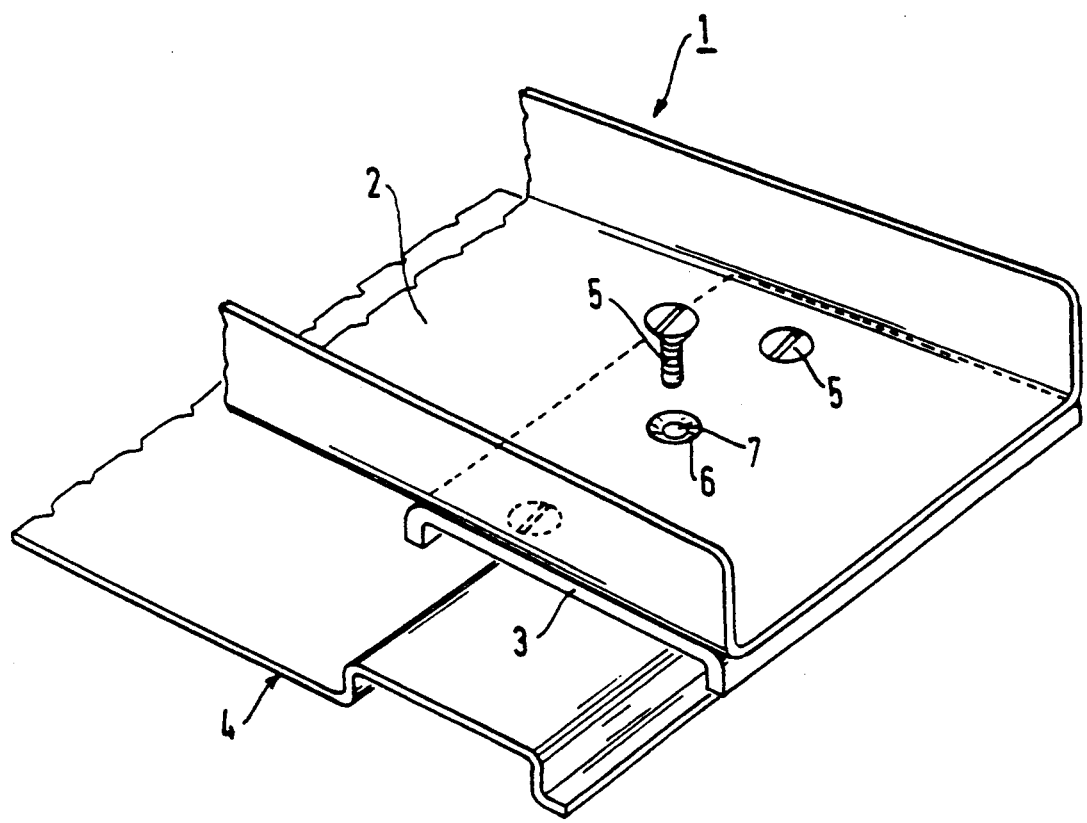
FIG. 1, already described, is a partial perspective view of a prior art tray.
Figure 2:
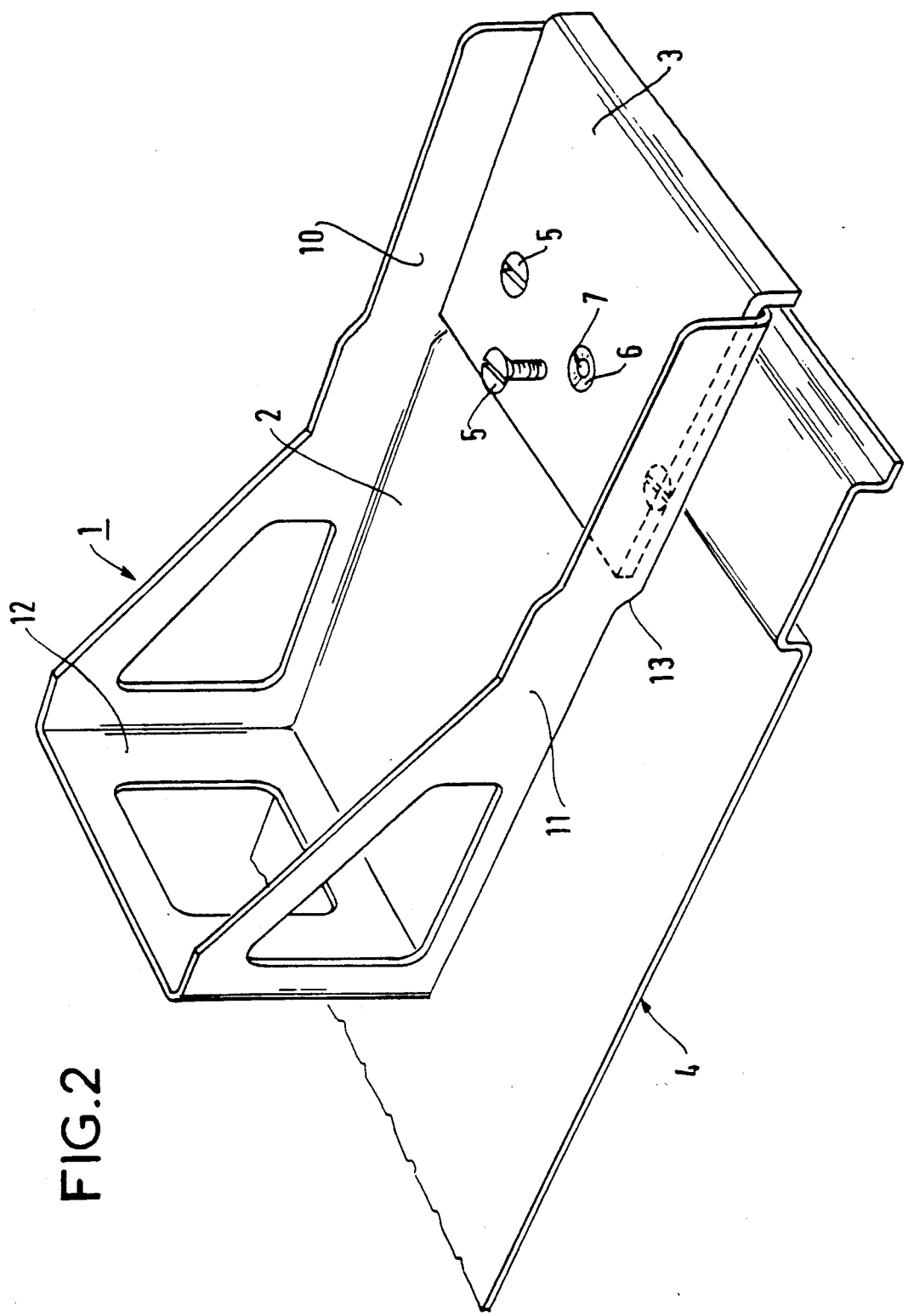
FIG. 2 is a perspective view of a tray in accordance with the invention.

FIG. 2 shows an avionic tray 1. The tray comprises a base plate 2, side rails 10 and 11 and a back plate 12. The tray is adapted to be fixed to a shelf 4.

According to the invention the front part of the base plate 2 of the tray 1 is reinforced by a reinforcing plate 3 but this is fixed on top of, rather than underneath, the base plate 2 of the tray 1. It is riveted and/or spot welded in place in the usual way. The reinforcing plate 3 is 2 mm thick, for example, while the aluminum alloy tray 1 is only 1.6 mm thick. To compensate for the increased thickness due to the reinforcing plate 3 the base plate 1 has a downward step 13 whose height is equal to the thickness of the plate so that the latter's upper surface is level with the more rearward part of the base plate 2 and there is no impediment to insertion of the case.

The tray is fixed to the shelf 4 by countersunk head screws 5. The head of each screw is accommodated in a countersink or stamped housing 6 around the hole 7 for the fixing screw through the plate 3 and the base plate 2.

There is claimed:

1. Avionic tray adapted to be fixed to a shelf and comprising a base plate, side rails and a back plate, wherein at least a forward end of said base plate of said tray is reinforced by a reinforcing plate fixed to the upper surface of said base plate, the part of said base plate carrying said reinforcing plate is stepped downwards so that the upper surface of said reinforcing plate is level with the surface of said base plate to the rear of said reinforcing plate, and fixing holes are provided in said reinforcing plate and said base plate for fixing said tray to said shelf by means of screws whose heads are housed in housings in said reinforcing plate.

2. Tray according to claim 1 wherein said reinforcing plate is thicker than said base plate of said tray.

* * * * *